United States Patent
Yang et al.

(10) Patent No.: US 9,202,582 B1
(45) Date of Patent: Dec. 1, 2015

(54) FLASH-MEMORY LOW-SPEED READ MODE CONTROL CIRCUIT

(71) Applicants: Guangjun Yang, Shanghai (CN); Chuhua Feng, Shanghai (CN)

(72) Inventors: Guangjun Yang, Shanghai (CN); Chuhua Feng, Shanghai (CN)

(73) Assignee: Shanghai Huahong Grace Semiconductor Manufacturing Corporation, Pudong New Area, Shanghai (CN)

( * ) Notice: Subject to any disclaimer, the term of this patent is extended or adjusted under 35 U.S.C. 154(b) by 0 days.

(21) Appl. No.: 14/578,555

(22) Filed: Dec. 22, 2014

(30) Foreign Application Priority Data

May 16, 2014 (CN) .......................... 2014 1 0206549

(51) Int. Cl.
| | | |
|---|---|---|
| G11C 16/04 | (2006.01) | |
| G11C 16/26 | (2006.01) | |
| G11C 16/30 | (2006.01) | |
| G11C 5/10 | (2006.01) | |
| G11C 16/06 | (2006.01) | |
| G11C 16/34 | (2006.01) | |

(52) U.S. Cl.
CPC *G11C 16/26* (2013.01); *G11C 5/10* (2013.01); *G11C 16/06* (2013.01); *G11C 16/30* (2013.01); *G11C 16/34* (2013.01)

(58) Field of Classification Search
CPC ........ G11C 16/26; G11C 16/30; G11C 16/06; G11C 16/34; G11C 5/10
USPC ........... 365/185.05, 185.18, 189.07; 327/544; 363/44, 89
See application file for complete search history.

(56) References Cited

U.S. PATENT DOCUMENTS

| 5,337,006 A | * | 8/1994 | Miyazaki | H03G 3/3047 330/130 |
|---|---|---|---|---|
| 5,408,324 A | * | 4/1995 | Sato | G01B 11/2518 250/559.24 |
| 6,049,473 A | * | 4/2000 | Jang | H02M 1/4216 363/44 |
| 6,225,992 B1 | * | 5/2001 | Hsu | G09G 3/3696 327/544 |
| 2013/0044547 A1 | * | 2/2013 | Berman | G11C 16/06 365/185.18 |

* cited by examiner

*Primary Examiner* — Gene Auduong
(74) *Attorney, Agent, or Firm* — Lau & Associates

(57) ABSTRACT

The present invention discloses a flash-memory low-speed read mode control circuit, which comprises a charge pump, a first voltage division circuit composed of two resistors and a first switch interconnected in series, and a second voltage division circuit composed of two capacitors interconnected in series. The first switch is used for switching between the data read mode of the low-speed read mode and the charge pump electric-leakage mode. In the data read mode, a first component voltage formed by the two resistors is fed back to the input terminal of the charge pump through a comparator, an NAND gate and a buffer, making a stable value of the output voltage of the charge pump proportional to the first component voltage. In the charge pump electric-leakage mode, the second voltage division circuit monitors the output voltage of the charge pump: when the output voltage is below a low threshold voltage, a feedback signal is formed and sent to the input terminal of the charge pump to make the charge pump turned on; when the output voltage is above a low threshold voltage, a feedback signal is formed and sent to the input terminal of the charge pump to make the charge pump stop working. The present invention can reduce the average current of the entire low-speed read mode significantly, and reduce the power consumption of the read process.

6 Claims, 3 Drawing Sheets

FLASH-MEMORY LOW-SPEED READ MODE CONTROL CIRCUIT

This application claims a foreign priority of Chinese Patent Application No. 201410206549.6 filed on May 16, 2014, which foreign priority of Chinese Patent Application, in its entirety, is incorporated herein by reference.

FIELD OF THE INVENTION

The present invention relates to a semiconductor integrated circuit, especially to a flash-memory low-speed read mode control circuit.

BACKGROUND OF THE INVENTION

In the entire read process of a flash memory, when the address conversion rate slows down, the flash memory may enter a waiting mode after the current address data is read and before the next address data is read. The low-speed read mode is generally called a data read mode having a lower address conversion rate, and specifically a low-speed read mode of the flash memory is generally defined to be a read mode having a read rate less than 30 MHZ. FIG. 1 is a timing diagram of an existing flash-memory low-speed read mode; the existing flash-memory low-speed read mode includes a normal data read mode, i.e. the mode of the region to which Active in FIG. 1 corresponds and the mode of the region to which Standbye in FIG. 1 corresponds, wherein the time of the data read mode is Ta, and the time of the waiting mode is Ts. The address signal Addres provides address for the read operation; the CEb pin of the flash memory, i.e. the Chip Enable (CE) signal, starts a read process at a low level; the charge pump of the flash memory outputs a voltage VD25_pre in the entire read process; and the clock signal CLK provides a clock signal for the charge pump.

It can be seen from FIG. 1 that the voltage VD25_pre is 3 V in the data read mode when Ta is 30 ns; in the prior art, the output voltage VD25_pre of the charge pump in the data read mode is less than the low threshold voltage of the charge pump, with the low threshold voltage in FIG. 1 being 3.6 V; when the data read is finished, since the output voltage VD25_pre of the charge pump is less than the low threshold voltage, the charge pump will start an automatic charging process, which makes the voltage VD25_pre in the waiting mode increase and up to a high threshold voltage of the charge pump, with the schematic high threshold voltage in FIG. 1 being 5 V; when increasing to the high threshold voltage, i.e. 5 V, the output voltage of the charge pump will start to decrease, and increase again after being as low as the low threshold voltage, i.e. 3.6 V. It can be seen that the charge pump of the flash memory will work and consume the current in the entire waiting mode of the prior art.

The average current in the entire low-speed read mode can be indicated by the following formula:

$$I_{avg} = (T_a * I_a + T_s * I_s)/(T_a + T_s);$$

wherein Iavg represents the average current in the entire low-speed read mode, Ia represents the current consumed by the flash memory in the data read mode, and Is represents the current consumed by the flash memory in the waiting mode, wherein the current consumed by the flash memory in the waiting mode is mainly the charge-pump current. It can be known that the current consumption in the entire read process is too great due to the presence of Is.

CONTENTS OF THE INVENTION

A technical problem to be solved by the present invention is to provide a flash-memory low-speed read mode control circuit, which can reduce the average current of the entire low-speed read mode significantly, and reduce the power consumption of the read process.

In order to solve above technical problem, the low-speed read mode in the flash-memory low-speed read mode control circuit provided by the present invention is a read mode having a read rate less than 30 MHZ, the flash-memory low-speed read mode control circuit comprising:

a charge pump, whose output terminal produces an output voltage when the charge pump is working;

an output terminal of the charge pump is connected to a first voltage division circuit, which includes a first resistor, a second resistor and a first switch connected in series, a first terminal of the first resistor being connected to an output terminal of the charge pump, a second terminal of the first resistor being connected to a first terminal of the second resistor, the first switch being connected between a second terminal of the second resistor and the ground; when the first switch is turned on, the flash memory is in a data read mode in the low-speed read mode; when the first switch is turned off, the flash memory is in a charge pump electric-leakage mode in the low-speed read mode;

in the data read mode, the second terminal of the first resistor outputs a first component voltage of the output voltage, which first component voltage is connected to a positive input terminal of the comparator; a negative input terminal of the comparator is connected to a supply voltage; the output terminal of the comparator is connected to a first input terminal of an NAND gate, with an output terminal of the NAND gate connected to the input terminal of the charge pump through a first buffer; the charge pump works when the input terminal of the charge pump is at a high level, and stops working when the input terminal of the charge pump is at a low level;

in the data read mode, the charge pump works when the first component voltage is below the supply voltage, and stops working when the first component voltage is equal to the supply voltage while keeping the output voltage of the charge pump at a stable value that is used as a data-read working voltage; the data-read working voltage is greater than the low threshold voltage of the charge pump in a waiting mode;

an output terminal of the charge pump is connected to a second voltage division circuit, which is composed of a first capacitor and a second capacitor interconnected in series, a first terminal of the first capacitor being connected to the output terminal of the charge pump, the second capacitor being connected between a second terminal of the first capacitor and the ground, the second terminal of the first capacitor outputting the second component voltage;

a first PMOS transistor, whose source electrode is connected to the supply voltage, a drain electrode of the first PMOS transistor being grounded through a first current source, a gate electrode of the first PMOS transistor being connected to the second component voltage; a proportional relation between the second component voltage and the output voltage is regulated by regulating capacitance of the first capacitor and the second capacitor: when the output voltage is less than or equal to the low threshold voltage of the charge pump, a voltage difference between the supply voltage and the second component voltage is greater than or equal to a threshold voltage of the first PMOS transistor, and makes the first PMOS transistor turned on; when the output voltage is greater than the low threshold voltage of the charge pump, a voltage difference between the supply voltage and the second component voltage is less than a threshold voltage of the first PMOS transistor, and makes the first PMOS transistor turned off;

a second NMOS transistor, whose source electrode is grounded, a drain electrode of the second NMOS transistor being connected to the supply voltage through a second current source, a gate electrode of the second NMOS transistor being connected to the drain electrode of the first PMOS transistor;

the drain electrode of the second NMOS transistor is connected to a reset terminal of a D flip flop through a second buffer, with this reset terminal resetting the D flip flop at a low level;

a D input terminal of the D flip flop is connected to the supply voltage, an input terminal of a clock is connected to an on-chip timing signal, and a Q output terminal is connected to a second input terminal of the NAND gate.

As a further improvement, in the charge pump electric-leakage mode, the output voltage of the charge pump starts to decrease from the stable value, with the output voltage of the charge pump made to be always greater than the low threshold voltage in the charge pump electric-leakage mode by setting a difference between the low threshold voltage and the stable value of the output voltage of the charge pump.

As a further improvement, the difference between the low threshold voltage and the stable value of the output voltage of the charge pump is 0.3-0.4 V.

As a further improvement, the stable value of the output voltage of the charge pump is made to be 2.2 times as much as the supply voltage by regulating the value of the first resistor and the second resistor; the low threshold voltage of the charge pump is set to be 2 times as much as the supply voltage.

The flash-memory low-speed read mode control circuit of the present invention can make the flash-memory low-speed read mode switched between the data read mode and the charge pump electric-leakage mode. In the data reading mode, the data-read working voltage outputted by the charge pump is made to be greater than the low threshold voltage of the charge pump, which can make the output voltage of the charge pump greater than the low threshold voltage when being switched from the data read mode to the charge pump electric-leakage mode, thereby avoiding charging the charge pump that is required for making the output voltage of the charge pump greater than the low threshold voltage in the charge pump electric-leakage mode. Therefore, in the charge pump electric-leakage mode of the present invention, all the charge pumps stop working before the output voltage of the charge pump decreases to the low threshold voltage. Thus the present invention can reduce the current consumption of the charge pump electric-leakage mode significantly. Besides, in the charge pump electric-leakage mode, when the output voltage of the charge pump is always greater than the low threshold voltage, the current consumption of the charge pump electric-leakage mode can be made to be 0. Therefore, the present invention can reduce the average current of the entire low-speed read mode significantly, and reduce the power consumption of the read process.

BRIEF DESCRIPTION OF THE DRAWINGS

The present invention will be further described below in detail with reference to drawings and embodiments.

DETAILED DESCRIPTION OF THE EMBODIMENTS

Figure 2:
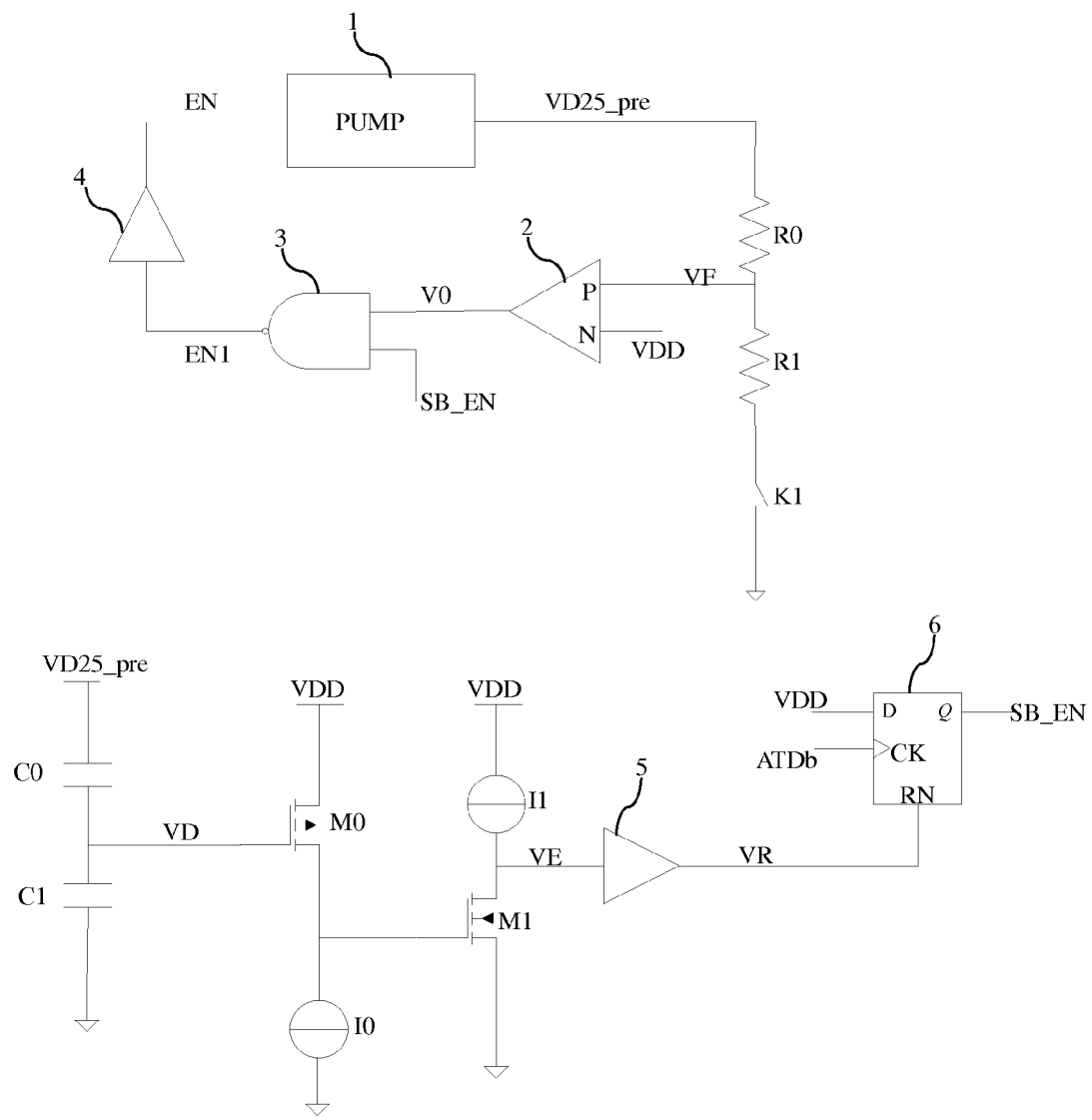
FIG. 2 is a control circuit diagram of the flash-memory low-speed read mode of the present invention.

FIG. 2 is a control circuit diagram of the flash-memory low-speed read mode of the present invention. In the entire read process of a flash memory, when the address conversion rate is less than the data read rate, a waiting mode may be inserted after the current address data is read and before the next address data is read, with a low-speed read mode of the flash memory generally defined to be a read mode having a read rate less than 30 MHZ. The flash-memory low-speed read mode control circuit of the example of the present invention comprises:

a charge pump 1, whose output terminal produces an output voltage VD25_pre when the charge pump is working;

an output terminal of the charge pump is connected to a first voltage division circuit, which includes a first resistor R0, a second resistor R1 and a first switch K1 connected in series, a first terminal of the first resistor R0 being connected to an output terminal of the charge pump 1, a second terminal of the first resistor R0 being connected to a first terminal of the second resistor R1, the first switch K1 being connected between a second terminal of the second resistor R1 and the ground; when the first switch K1 is turned on, the flash memory is in a data read mode in the low-speed read mode; when the first switch K1 is turned off, the flash memory is in a charge pump electric-leakage mode in the low-speed read mode.

In the data read mode, the second terminal of the first resistor R0 outputs a first component voltage VF of the output voltage VD25_pre, wherein the first component voltage VF is connected to a positive input terminal of the comparator 2, i.e. the P input terminal; a negative input terminal of the comparator 2, i.e. the N input terminal, is connected to a supply voltage VDD; the output terminal of the comparator 2 is connected to a first input terminal of an NAND gate 3; an output terminal of the NAND gate 3 outputs signal EN1 and connects to the input terminal of the charge pump 1 through a first buffer 4; the charge pump 1 works when the input terminal of the charge pump 1, i.e. the signal EN, is at a high level, and stops working when the input terminal of the charge pump 1 is at a low level.

In the data read mode, the charge pump 1 works when the first component voltage VF is below the supply voltage VDD, and stops working when the first component voltage VF is equal to the supply voltage VDD while keeping the output voltage VD25_pre of the charge pump 1 at a stable value that is used as a data-read working voltage; the data-read working voltage is greater than the low threshold voltage of the charge pump in a waiting mode.

Figure 1:
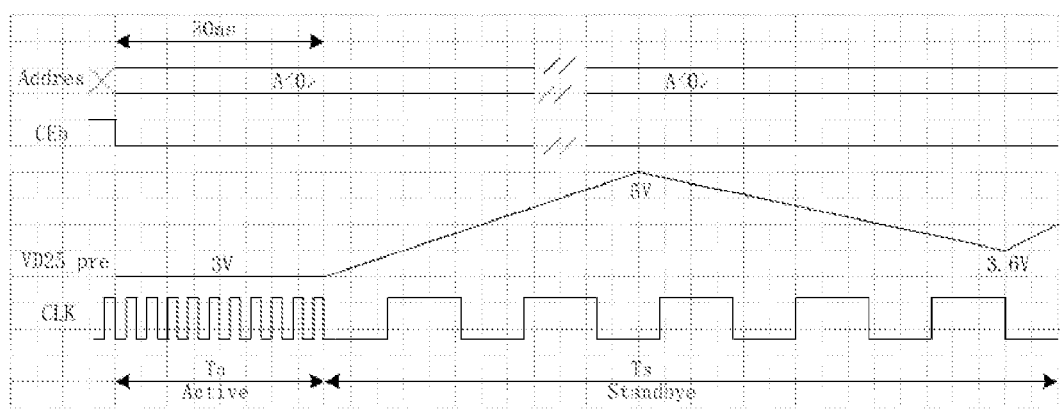
FIG. 1 is a timing diagram of an existing flash-memory low-speed read mode.

When the data read finished and the output voltage VD25_pre is less than the low threshold voltage of the charge pump in the waiting mode, the low-speed read mode will be switched to the waiting mode directly, without entering the charge pump electric-leakage mode of the example of the present invention; after entering the waiting mode, the pump charge will be charged, thereby resulting in the situation as shown in FIG. 1, see the description in the Background of the Invention for details. However, with the example of the present invention setting the data-read working voltage to be greater than the low threshold voltage of the charge pump, the output voltage VD25_pre can be made to be directly greater than the low threshold voltage of the charge pump when the data read is finished, and thus the low-speed read mode cannot be switched to the waiting mode but switched directly to the charge pump electric-leakage mode, thereby avoiding the situation in the prior art in which the charge pump is bound to be charged when entering the waiting mode that occurs when the date-read working voltage is set to be less than the low threshold voltage of the pump charge, which can reduce the current consumption significantly.

An output terminal of the charge pump 1 is connected to a second voltage division circuit, which is composed of a first capacitor C0 and a second capacitor C1 interconnected in series, a first terminal of the first capacitor C0 being connected to the output terminal of the charge pump 1, i.e. the input signal VD25_pre, the second capacitor C1 being connected between a second terminal of the first capacitor C0 and the ground, the second terminal of the first capacitor C0 outputting the second component voltage VD; a first PMOS transistor M0, whose source electrode is connected to the supply voltage VDD, a drain electrode of the first PMOS transistor M0 being grounded through a first current source I0, a gate electrode of the first PMOS transistor M0 being connected to the second component voltage VD; a proportional relation between the second component voltage VD and the output voltage VD25_pre is regulated by regulating capacitance of the first capacitor C0 and the second capacitor C1: when the output voltage VD25_pre is less than or equal to the low threshold voltage of the charge pump 1, a voltage difference between the supply voltage VDD and the second component voltage VD is greater than or equal to a threshold voltage of the first PMOS transistor M0, and makes the first PMOS transistor M0 turned on; when the output voltage VD25_pre is greater than the low threshold voltage of the charge pump 1, a voltage difference between the supply voltage VDD and the second component voltage VD is less than a threshold voltage of the first PMOS transistor M0, and makes the first PMOS transistor M0 turned off.

A second NMOS transistor M1, whose source electrode is grounded, a drain electrode of the second NMOS transistor M1 being connected to the supply voltage VDD through a second current source I1, a gate electrode of the second NMOS transistor M1 being connected to the drain electrode of the first PMOS transistor M0.

The drain electrode of the second NMOS transistor M1 is connected to a reset terminal of a D flip flop 6, i.e. the RN terminal, through a second buffer 5; that is, the voltage signal VE outputted by the drain electrode of the second NMOS M1 produces a voltage signal VR after being buffered, which is inputted to the reset terminal of the D flip flop 6, with the reset terminal resetting the D flip flop 6 at a low level.

A D input terminal of the D flip flop 6 is connected to the supply voltage VDD, an input terminal of a clock, i.e. the CK terminal, is connected to an on-chip timing signal ATDb, and a Q output terminal outputs a signal SB_EN and is connected to a second input terminal of the NAND gate 3; the on-chip timing signal ATDb is a signal produced by an on-chip timing signal generation circuit in the flash memory, with the on-chip timing signal generation circuit obtaining the on-chip timing signal ATDb through detection of the address change and regulation of the pulse width.

In the charge pump electric-leakage mode, the output voltage VD25_pre of the charge pump 1 starts to decrease from the stable value; by setting the difference between the stable value of the output voltage VD25_pre of the charge pump 1 and the low threshold voltage, preferably to be 0.3-0.4 V, the output voltage VD25_pre of the charge pump 1 in the charge pump electric-leakage mode is made to be always greater than the low threshold voltage, which can make the charge-pump current in the charge pump electric-leakage mode be 0, minimizing the average current of the entire low-speed read mode, reducing the power consumption.

Preferably, the stable value of the output voltage VD25_pre of the charge pump is made to be 2.2 times as much as the supply voltage VDD by regulating the value of the first resistor R0 and the second resistor R1; the low threshold voltage of the charge pump 1 is set to be 2 times as much as the supply voltage VDD.

Figure 3:
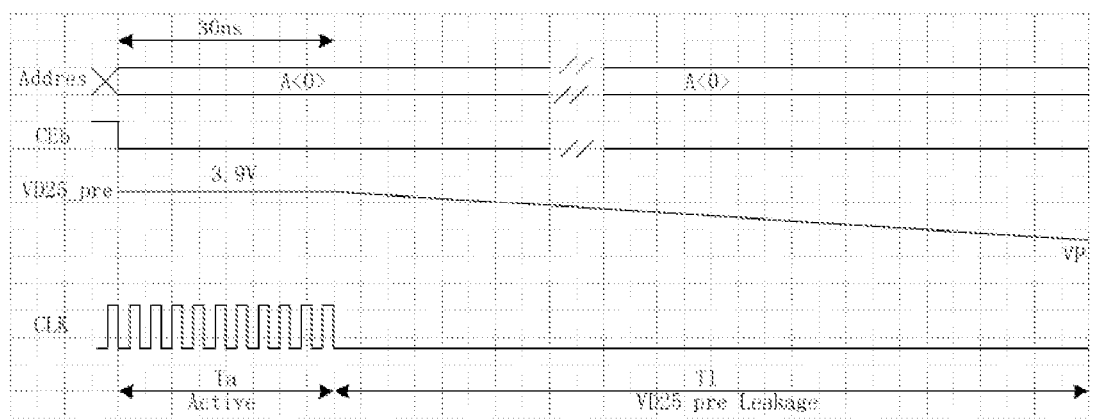
FIG. 3 is a timing diagram of the flash-memory low-speed read mode of the present invention.

FIG. 3 is a timing diagram of the flash-memory low-speed read mode of the present invention. A normal data read mode is the mode of the region to which Active in FIG. 3 corresponds, and a normal charge pump electric-leakage mode is the mode of the region to which Standbye in FIG. 3 corresponds, wherein the time of the data read mode is Ta, and the time of the waiting mode is TL. The address signal Addres provides address for the read operation, the CEb pin signal of the flash memory starts a read process when at a low level, the charge pump of the flash memory outputs a voltage VD25_pre in the entire read process, and the clock signal CLK provides a clock for the read process. It can be seen from FIG. 3 that Ta is 30 ns, and the voltage VD25_pre is 3.9 V in the data read mode and will decrease gradually in the charge pump electric-leakage mode.

The average current in the entire low-speed read mode can be indicated by the following formula:

$$I_{avg}=(T_a \times I_a + T_L \times I_L)/(T_a + T_L)$$

Wherein Iavg represents the average current in the entire low-speed read mode, Ia represents the current consumed by the flash memory in the data read mode, and $I_L$ represents the current consumed by the flash memory in the charge pump electric-leakage mode.

In FIG. 3, when the charge pump electric-leakage mode is ended, if the voltage VP is greater than the low threshold voltage of the charge pump, and the charge pump of the flash memory will not be started in the entire charge pump electric-leakage mode, then $I_L \approx 0$ μA.

The final average current: $I_{avg} \approx (T_a \times I_a)/(T_a + T_L)$.

Therefore, the present invention can make the average current of the entire read process reduced significantly.

The present invention is described above in detail with reference to a specific example, which however does not restrict the present invention. Without departing from the principle of the present invention, those skilled in the art can also make many variations and improvements, which should also be considered to be within the scope of protection of the present invention.

What is claimed is:

1. A flash-memory low-speed read mode control circuit, with a low-speed read mode of a flash memory being a read mode having a read rate less than 30 MHZ, comprising:
   a charge pump, whose output terminal produces an output voltage when the charge pump is working;
   an output terminal of the charge pump is connected to a first voltage division circuit, wherein the first voltage division circuit includes a first resistor, a second resistor and a first switch connected in series, a first terminal of the first resistor being connected to an output terminal of the charge pump, a second terminal of the first resistor being connected to a first terminal of the second resistor, the first switch being connected between a second terminal of the second resistor and the ground; when the first switch is turned on, the flash memory is in a data read mode in the low-speed read mode; when the first switch is turned off, the flash memory is in a charge pump electric-leakage mode in the low-speed read mode;
   in the data read mode, the second terminal of the first resistor outputs a first component voltage of the output voltage, which first component voltage is connected to a positive input terminal of the comparator; a negative input terminal of the comparator is connected to a supply voltage; the output terminal of the comparator is connected to a first input terminal of an NAND gate, with an output terminal of the NAND gate connected to the input terminal of the charge pump through a first buffer; the charge pump works when the input terminal of the charge pump is at a high level, and stops working when the input terminal of the charge pump is at a low level;

in the data read mode, the charge pump works when the first component voltage is below the supply voltage, and stops working when the first component voltage is equal to the supply voltage while keeping the output voltage of the charge pump at a stable value that is used as a data-read working voltage; the data-read working voltage is greater than the low threshold voltage of the charge pump in a waiting mode;

an output terminal of the charge pump is connected to a second voltage division circuit, which is composed of a first capacitor and a second capacitor interconnected in series, a first terminal of the first capacitor being connected to the output terminal of the charge pump, the second capacitor being connected between a second terminal of the first capacitor and the ground, the second terminal of the first capacitor outputting the second component voltage;

a first PMOS transistor, whose source electrode is connected to the supply voltage, a drain electrode of the first PMOS transistor being grounded through a first current source, a gate electrode of the first PMOS transistor being connected to the second component voltage; a proportional relation between the second component voltage and the output voltage is regulated by regulating capacitance of the first capacitor and the second capacitor: when the output voltage is less than or equal to the low threshold voltage of the charge pump, a voltage difference between the supply voltage and the second component voltage is greater than or equal to a threshold voltage of the first PMOS transistor, and makes the first PMOS transistor turned on; when the output voltage is greater than the low threshold voltage of the charge pump, a voltage difference between the supply voltage and the second component voltage is less than a threshold voltage of the first PMOS transistor, and makes the first PMOS transistor turned off;

a second NMOS transistor, whose source electrode is grounded, a drain electrode of the second NMOS transistor being connected to the supply voltage through a second current source, a gate electrode of the second NMOS transistor being connected to the drain electrode of the first PMOS transistor;

the drain electrode of the second NMOS transistor is connected to a reset terminal of a D flip flop through a second buffer, with this reset terminal resetting the D flip flop at a low level;

a D input terminal of the D flip flop is connected to the supply voltage, an input terminal of a clock is connected to an on-chip timing signal, and a Q output terminal is connected to a second input terminal of the NAND gate.

2. The flash-memory low-speed read mode control circuit according to claim 1, wherein in the charge pump electric-leakage mode, the output voltage of the charge pump starts to decrease from the stable value, with the output voltage of the charge pump made to be always greater than the low threshold voltage in the charge pump electric-leakage mode by setting a difference between the low threshold voltage and the stable value of the output voltage of the charge pump.

3. The flash-memory low-speed read mode control circuit according to claim 2, wherein the difference between the low threshold voltage and the stable value of the output voltage of the charge pump is 0.3-0.4 V.

4. The flash-memory low-speed read mode control circuit according to claim 1 wherein the stable value of the output voltage of the charge pump is made to be 2.2 times as much as the supply voltage by regulating a value of the first resistor and the second resistor; the low threshold voltage of the charge pump is set to be 2 times as much as the supply voltage.

5. The flash-memory low-speed read mode control circuit according to claim 2, wherein the stable value of the output voltage of the charge pump is made to be 2.2 times as much as the supply voltage by regulating a value of the first resistor and the second resistor; the low threshold voltage of the charge pump is set to be 2 times as much as the supply voltage.

6. The flash-memory low-speed read mode control circuit according to claim 3, wherein the stable value of the output voltage of the charge pump is made to be 2.2 times as much as the supply voltage by regulating a value of the first resistor and the second resistor; the low threshold voltage of the charge pump is set to be 2 times as much as the supply voltage.

* * * * *